(12) United States Patent
Tan et al.

(10) Patent No.: US 7,972,882 B2
(45) Date of Patent: Jul. 5, 2011

(54) MICRORESONATOR SYSTEMS AND METHODS OF FABRICATING THE SAME

(75) Inventors: Michael Renne Ty Tan, Menlo Park, CA (US); Shih-Yuan Wang, Palo Alto, CA (US); Duncan Stewart, Menlo Park, CA (US); David A. Fattal, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 163 days.

(21) Appl. No.: 12/479,604

(22) Filed: Jun. 5, 2009

(65) Prior Publication Data
US 2009/0239323 A1    Sep. 24, 2009

Related U.S. Application Data

(62) Division of application No. 11/888,016, filed on Jul. 30, 2007, now Pat. No. 7,561,770.

(51) Int. Cl.
*H01L 21/00* (2006.01)
(52) U.S. Cl. .......................................... 438/31
(58) Field of Classification Search ................ 438/31
See application file for complete search history.

(56) References Cited

U.S. PATENT DOCUMENTS

| | | | |
|---|---|---|---|
| 5,652,556 A | 7/1997 | Flory | |
| 6,891,865 B1 | 5/2005 | Ma | |
| 6,940,878 B2 | 9/2005 | Orenstein | |
| 7,106,917 B2 | 9/2006 | Painter | |
| 2002/0021447 A1 | 2/2002 | Mizutani | |
| 2002/0114369 A1 | 8/2002 | Kinoshita | |
| 2002/0122615 A1 | 9/2002 | Painter | |
| 2003/0057427 A1 | 3/2003 | Chida | |
| 2003/0058908 A1 | 3/2003 | Griffel | |
| 2003/0202548 A1 | 10/2003 | Andersen | |
| 2004/0008942 A1 | 1/2004 | Scheuer | |
| 2005/0025199 A1 | 2/2005 | Ma | |
| 2005/0127383 A1 | 6/2005 | Kikawa | |

OTHER PUBLICATIONS

Hewlett-Packard Development Company, L.P.. "Microresonator Systems and Methods of Fabricating the Same", PCT International Search Report (ISA/KR), Feb. 23, 2009.

*Primary Examiner* — W. David Coleman

(57) ABSTRACT

Various embodiments of the present invention are related to microresonator systems and to methods for fabricating the microresonator systems. In one embodiment, a method of fabricating a microresonator system comprises: forming a multilayer system having a bottom layer, a top layer, and an intermediate layer having one or more quantum wells and sandwiched between the bottom layer and the top layer; embedding at least one waveguide in a substrate having a top surface, the at least one waveguide positioned adjacent to the top surface of the substrate; wafer bonding the top layer of the multilayer system to the top surface of the substrate; forming a microresonator in the multilayer system, wherein at least a portion of a peripheral annular region of the microresonator is portioned above the at least one waveguide; and forming a current isolation region in at least a portion of a central region of the microresonator.

8 Claims, 18 Drawing Sheets

MICRORESONATOR SYSTEMS AND METHODS OF FABRICATING THE SAME

CROSS-REFERENCE TO RELATED APPLICATION

The present application is a divisional application of application Ser. No. 11/888,016, filed Jul. 30, 2007 now U.S. Pat. No. 7,561,770, the contents of which are hereby incorporated herein in their entireties.

TECHNICAL FIELD

Embodiments of the present invention are directed to microresonator systems, and, in particular, to microresonator systems that can be used as lasers, modulators, and photodetectors and to the methods for fabricating these systems.

BACKGROUND

In recent years, the increasing density of microelectronic devices on integrated circuits has lead to a technological bottleneck in the density of metallic signal lines that can be used to interconnect these devices. In addition, the use of metallic signal lines yields a significant increase in power consumption and difficulties with synchronizing the longest links positioned on top of most circuits. Rather than transmitting information as electrical signals via signal lines, the same information can be encoded in electromagnetic radiation ("ER") and transmitted via waveguides, such as optical fibers, ridge waveguides, and photonic crystal waveguides. Transmitting information encoded in ER via waveguides has a number of advantages over transmitting electrical signals via signal lines. First, degradation or loss is much less for ER transmitted via waveguides than for electrical signals transmitted via signal lines. Second, waveguides can be fabricated to support a much higher bandwidth than signal lines. For example, a single Cu or Al wire can only transmit a single electrical signal, while a single optical fiber can be configured to transmit about 100 or more differently encoded ER.

Recently, advances in materials science and semiconductor fabrication techniques have made it possible to develop photonic devices that can be integrated with electronic devices, such as CMOS circuits, to form photonic integrated circuits ("PICs"). The term "photonic" refers to devices that can operate with either classically characterized ER or quantized ER with frequencies that span the electromagnetic spectrum. PICs are the photonic equivalent of electronic integrated circuits and may be implemented on a wafer of semiconductor material. In order to effectively implement PICs, passive and active photonic components are needed. Waveguides and attenuators are examples of passive photonic components that can typically be fabricated using conventional epitaxial and lithographic methods and may be used to direct the propagation of ER between microelectronic devices. Physicists and engineers have recognized a need for active photonic components that can be used in PICs.

SUMMARY

Various embodiments of the present invention are related to microresonator systems comprising a microdisk that can be used as a laser, a modulator, and a photodetector and to methods for fabricating the microresonator systems. In one embodiment of the present invention, a microresonator system comprises a substrate having a top surface layer, at least one waveguide embedded within the substrate and positioned adjacent to the top surface layer of the substrate, and a microdisk having a top layer, an intermediate layer, a bottom layer, current isolation region, and a peripheral annular region. The bottom layer of the microdisk is attached to and in electrical communication with the top surface layer of the substrate and is positioned so that at least a portion of the peripheral annular region is located above the at least one waveguide. The current isolation region is configured to occupy at least a portion of a central region of the microdisk and has a relatively lower index of refraction and relatively larger bandgaps than the peripheral annular region.

DESCRIPTION OF EMBODIMENTS

Figure 1A:
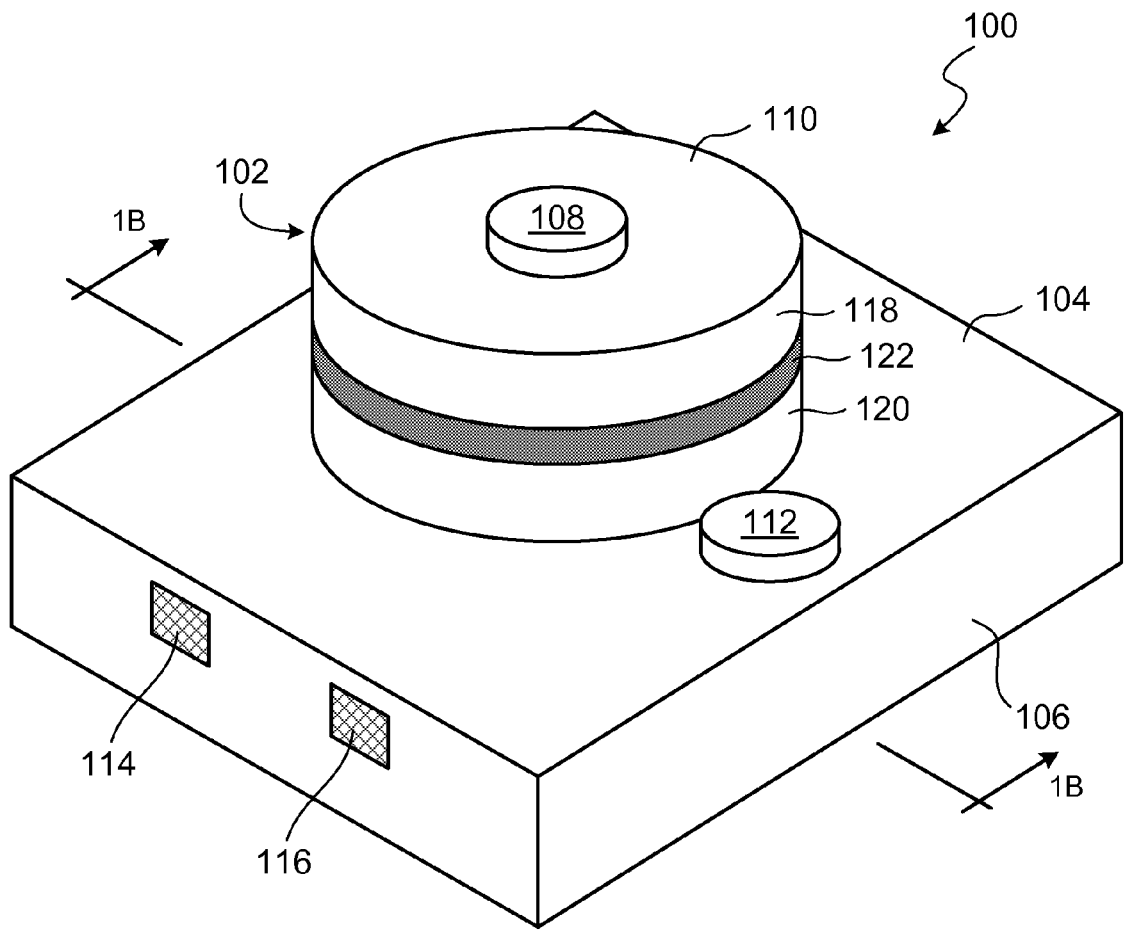
FIG. 1A shows an isometric view of a first microresonator system in accordance with embodiments of the present invention.

Various embodiments of the present invention are related to microscale resonator ("microresonator") systems comprising a microdisk that can be used as a laser, a modulator, and a photodetector and to methods for fabricating the microresonator systems. In the various microresonator system embodiments described below, a number of structurally similar components comprising the same materials have been provided with the same reference numerals and, in the interest of brevity, an explanation of their structure and function is not repeated.

FIG. 1A shows an isometric view of a microresonator system 100 in accordance with embodiments of the present invention. Microresonator system 100 comprises a microdisk 102 attached to a top surface layer 104 of a substrate 106, a first electrode 108 attached to a top surface 110 of microdisk 102, and a second electrode 112 attached to top surface layer 104 and positioned adjacent to microdisk 102. Microdisk 102 is a microresonator of microresonator system 100 and can be configured to support certain WGMs. Substrate 106 includes two waveguides 114 and 116 that extend through substrate 106 and are positioned adjacent to top surface layer 104. Waveguides 114 and 116 are located beneath at least a portion of a peripheral annular region of microdisk 102. Microdisk 102 comprises a top layer 118, a bottom layer 120, and an intermediate layer 122 sandwiched between top layer 118 and bottom layer 120. Bottom layer 120 can be comprised of the same material as top surface layer 104, as described below with reference to FIG. 1B. Layers 118, 120, and 122 of microdisk 102 are described in greater detail below with reference to FIG. 2.

Figure 1B:
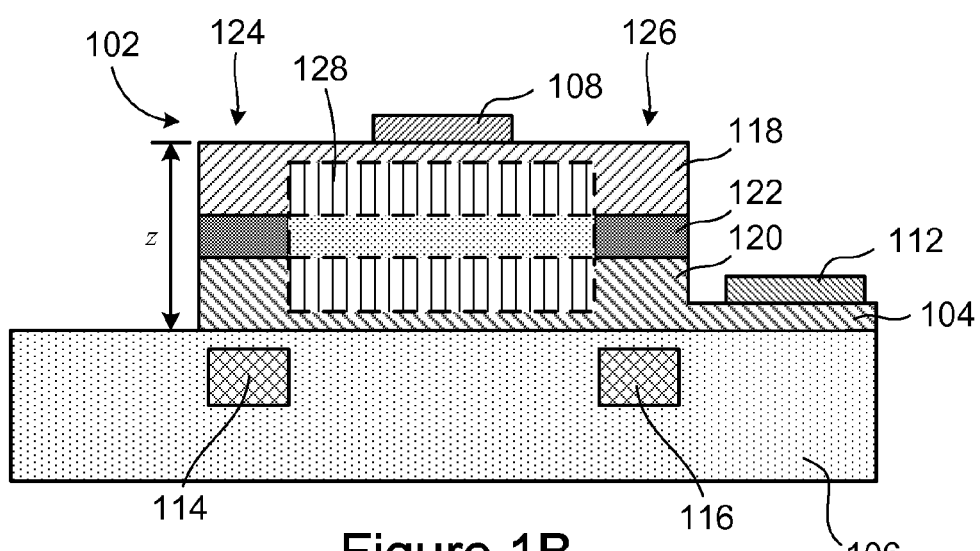
FIG. 1B shows a cross-sectional view of the first microresonator system along a line 1B-1B, shown in FIG. 1A, in accordance with embodiments of the present invention.

FIG. 1B shows a cross-sectional view of microresonator system 100 along a line 1B-1B, shown in FIG. 1A, in accordance with embodiments of the present invention. As shown in FIG. 1B, waveguides 114 and 116 are located beneath portions 124 and 126 of the peripheral annular region of microdisk 102. Microdisk 102 includes a current isolation region 128 configured to occupy at least a portion of a central region of microdisk 102. Second electrode 112 is in electrical communication with bottom layer 120 via top surface layer 104. Although only a single second electrode 112 is located on top surface layer 104 of substrate 106, in other embodiments of the present invention, two or more electrodes can be positioned on top surface layer 104.

Note that the microresonators of the microresonator system embodiments of the present invention are not limited to circular-shaped microdisks, such as microdisk 102. In other embodiments of the present invention, the microdisk 102 can be circular, elliptical, or have any other shape that is suitable for supporting a WGM and creating resonant ER.

Figure 2:
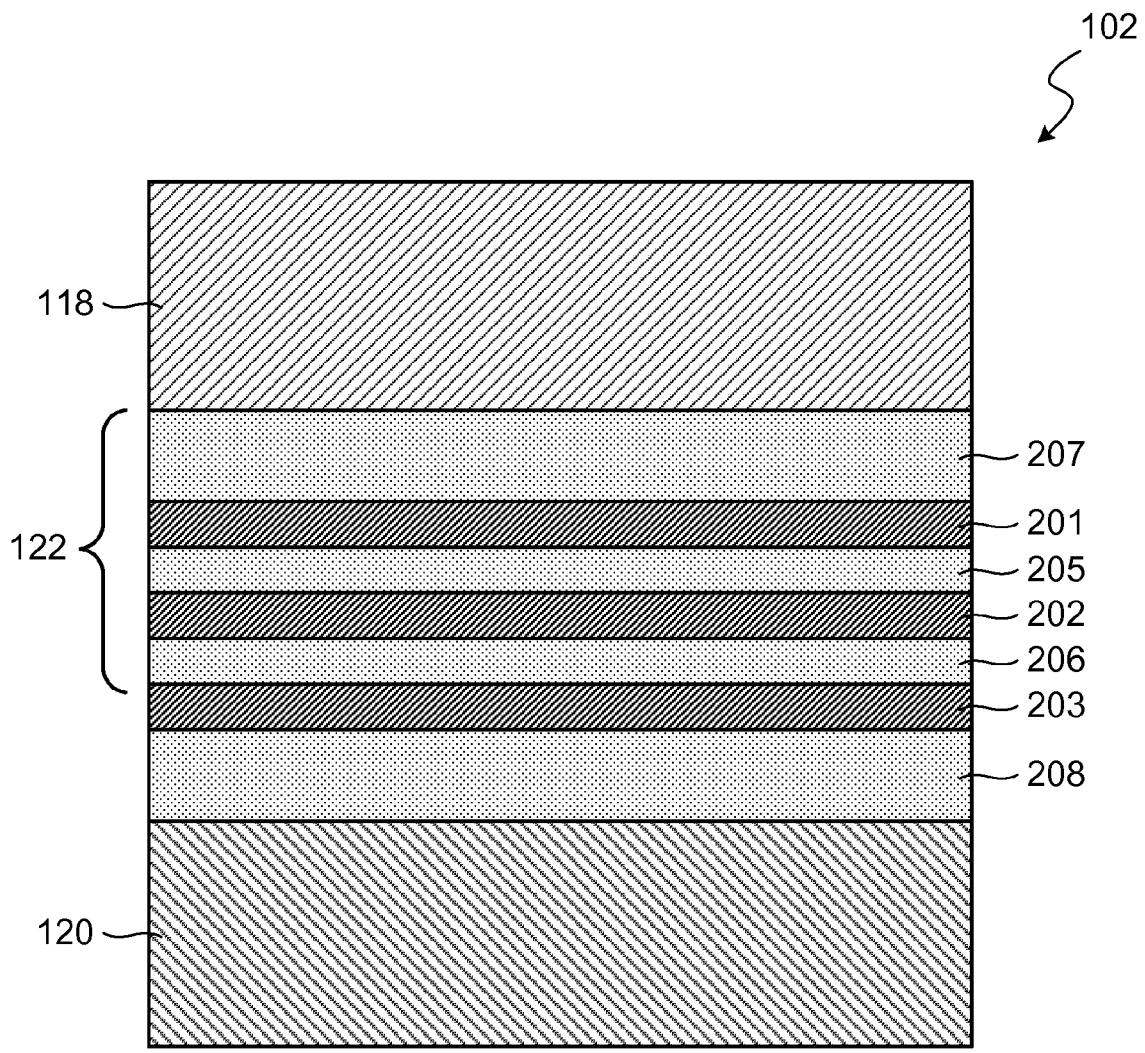
FIG. 2 shows a cross-sectional view of layers comprising an exemplary microdisk in accordance with embodiments of the present invention.

Top layer 118 can be a III-V semiconductor doped with an electron acceptor dopant, which is referred to as a "p-type semiconductor," and bottom layer 120 can be a III-V semiconductor doped with an electron donor dopant, which is referred to as an "n-type semiconductor," where Roman numerals III and V refer to elements in the third and fifth columns of the Periodic Table of the Elements. Intermediate layer 122 includes one or more quantum wells. Each quantum well can be a relatively thin III-V semiconductor layer sandwiched between two layers of a different type of III-V semiconductor. FIG. 2 shows a cross-sectional view of layers comprising microdisk 102 in accordance with embodiments of the present invention. In FIG. 2, top layer 118 can be p-type InP, where Zn can be used as the dopant, and bottom layer 120 can be n-type InP, where Si can be used as the dopant. Intermediate layer 122 includes three quantum wells 201-203 of $In_xGa_{1-x}As_yP_{1-y}$, where x and y range between 0 and 1. Intermediate layer 122 also includes barrier layers 205-208 of $In_xGa_{1-x}As_yP_{1-y}$, where x and y range between 0 and 1. The choice of parameters x and y are made to lattice match adjacent layers and are well-known in the art. For example, for layers which are latticed matched to InP layers 118 and 120, the x value is chosen to be 0.47. The choice of y determines the bandgap energy of the quantum well. Operation of a quantum well is described below with reference to FIG. 7A. The quantum wells 201-203 can be configured to emit ER at a desired wavelength λ while the barrier layers 205-208 can be configured to have a relatively larger bandgap in order to confine carriers (i.e., electrons and holes) injected into the quantum well. Layers 205 and 206 separate quantum wells 201-203, and layers 207 and 208 are two relatively thicker layers that separate quantum wells 201 and 203 from layers 118 and 120, respectively. Substrate 106 can be comprised of $SiO_2$, $Si_3N_4$ or another suitable dielectric insulating material. Waveguides 114 and 116 can be comprised of a column IV element, such as Si and Ge. In other embodiments of the present invention, other suitable III-V semiconductor, such as GaAs, GaP or GaN, may be used.

Figure 3A:
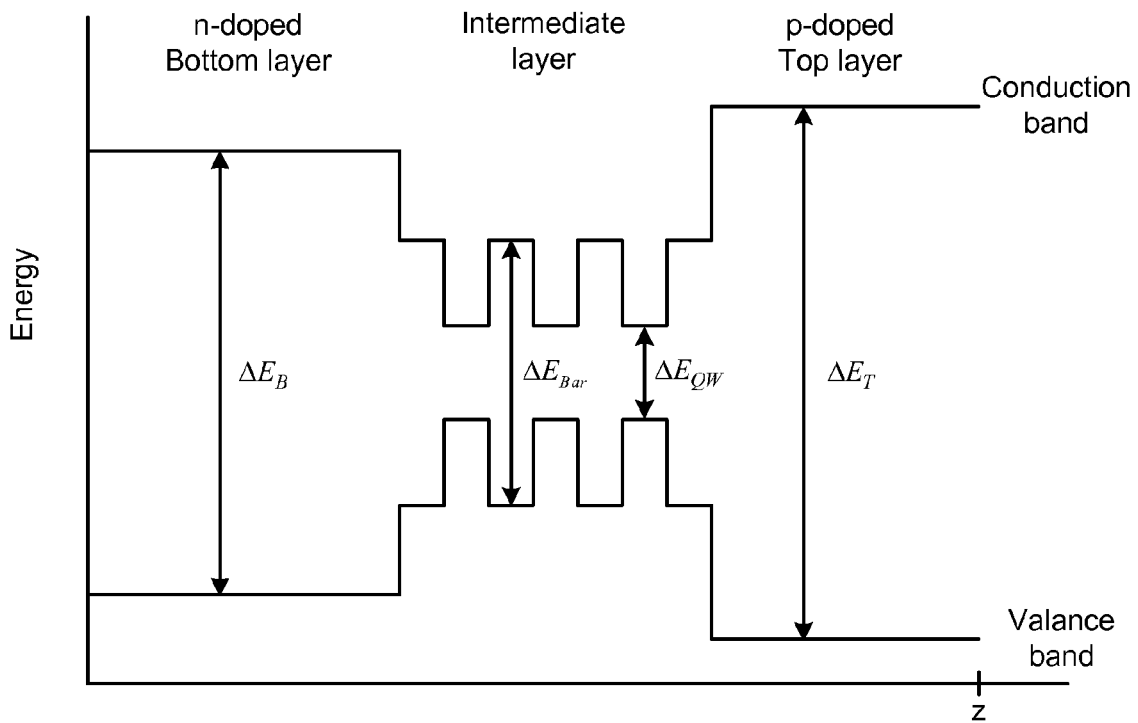
FIGS. 3A-3B show hypothetical plots of electronic bandgap energies for peripheral and current isolating regions of the microdisk shown in FIG. 1.
Figure 3B:
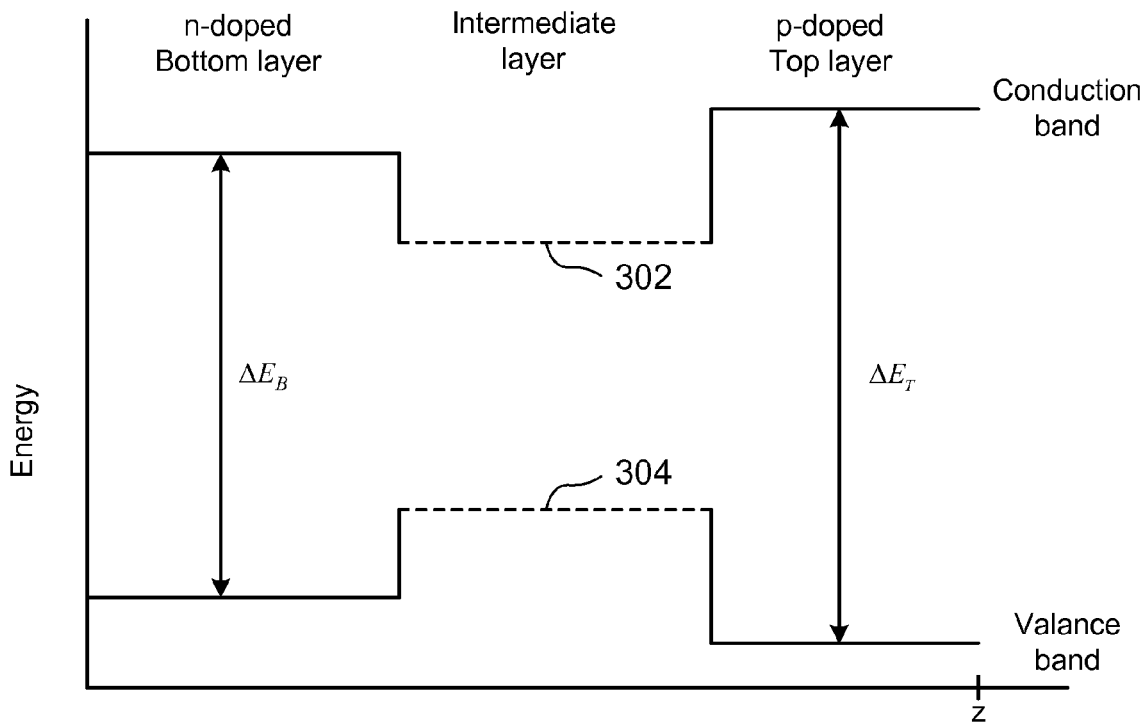

Current isolation region 128 has a relatively larger electronic bandgap than the quantum well electronic bandgaps associated with the peripheral annular region of microdisk 102. FIG. 3A shows a plot of electronic bandgap energies versus microdisk 102 height z for three quantum wells of the peripheral regions of microdisk 102. The electronic bandgap energies associated with bottom layer 120 and top layer 118 are represented by $\Delta E_B$ and $\Delta E_T$, respectively. The quantum wells in intermediate layer 122 have bandgap energies $\Delta E_{QW}$, and the barrier layers adjacent to the quantum well layers have larger bandgap energies $\Delta E_{Bar}$. Note that the bandgap energies $\Delta E_T$ and $\Delta E_B$ are larger than the bandgap energy $\Delta E_{Bar}$, which corresponds to layers 118 and 120 forming a double heterojunction barrier for confining electrons and holes to intermediate layer 122. FIG. 3B shows a plot of electronic bandgap energies versus microdisk 102 height z for current isolation region 128 of microdisk 102. As shown in FIG. 3B, current isolation region 128 eliminates or makes the bandgap energies associated with the quantum well layers and the barrier layers of intermediate layer 122 indeterminate, as represented by dashed line energy levels 302 and 304.

Figure 4A:
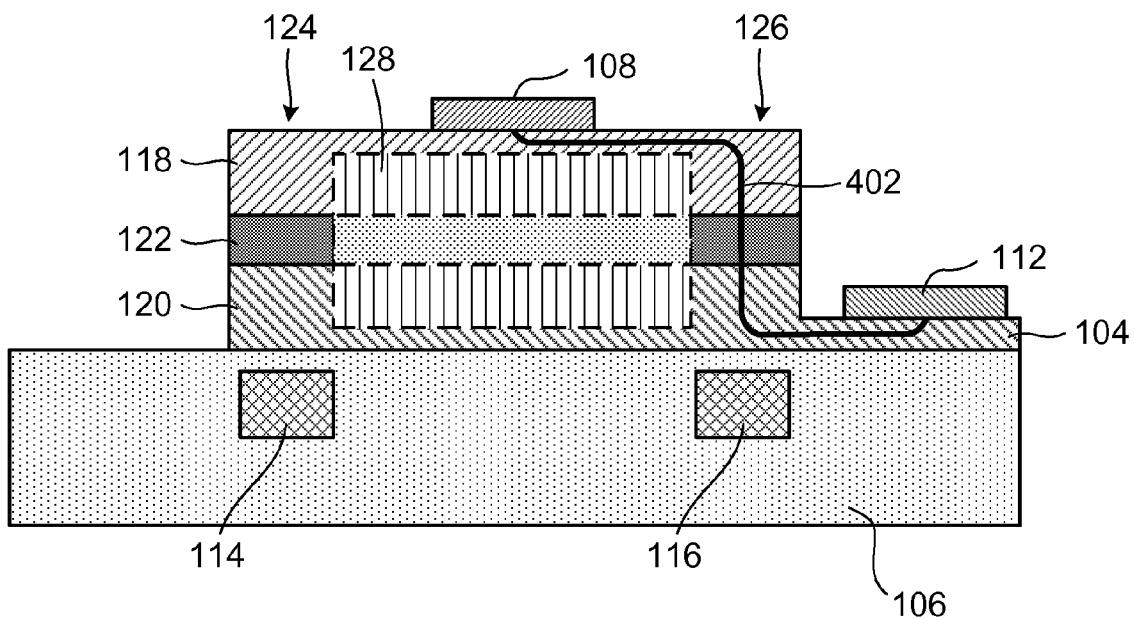
FIG. 4A shows a path of current flow in a microdisk of the first microresonator system, shown in FIG. 1, in accordance with embodiments of the present invention.

The difference between the electronic bandgap energies associated with current isolation region 128 and the peripheral region of microdisk 102 can be used to substantially confine current to paths in the peripheral region when a voltage is applied to electrodes 108 and 112. FIG. 4A shows a path 402 representing the flow of current between electrodes 108 and 112 in accordance with embodiments of the present invention. Path 402 bends around higher bandgap current isolation region 128 in connecting electrodes 108 and 112. Current can be substantially confined to peripheral regions of microdisk 102, such as peripheral region 126, as follows. Consider applying a voltage to electrodes 108 and 112 that is larger than the electronic bandgap energies associated with the peripheral annular region but does not exceed the electronic bandgap energy associated with current isolation region 128. Because the voltage is large enough, current can flow through peripheral region 126, but current cannot flow through current isolation region 128. In other words, current can be substantially confined to peripheral region 126 using relatively lower voltages than the voltages needed for current to flow through current isolation region 128. Current paths avoiding current isolation region 128, such as path 402, represent lower energy paths for current to flow along between electrodes 108 and 112.

In general, because a microresonator has a larger overall index of refraction than its surrounds, ER transmitted within microdisk typically becomes trapped as a result of total internal reflection near the circumference of the microdisk. Modes of ER that are trapped near the circumference of the microdisk are called "whispering gallery modes ('WGMs')." A WGM has a particular resonant wavelength λ that is related to the diameter of a microdisk. However, for a typical microdisk, other modes exist which do not confine ER near the circumference in the form of a WGM.

Figure 4B:
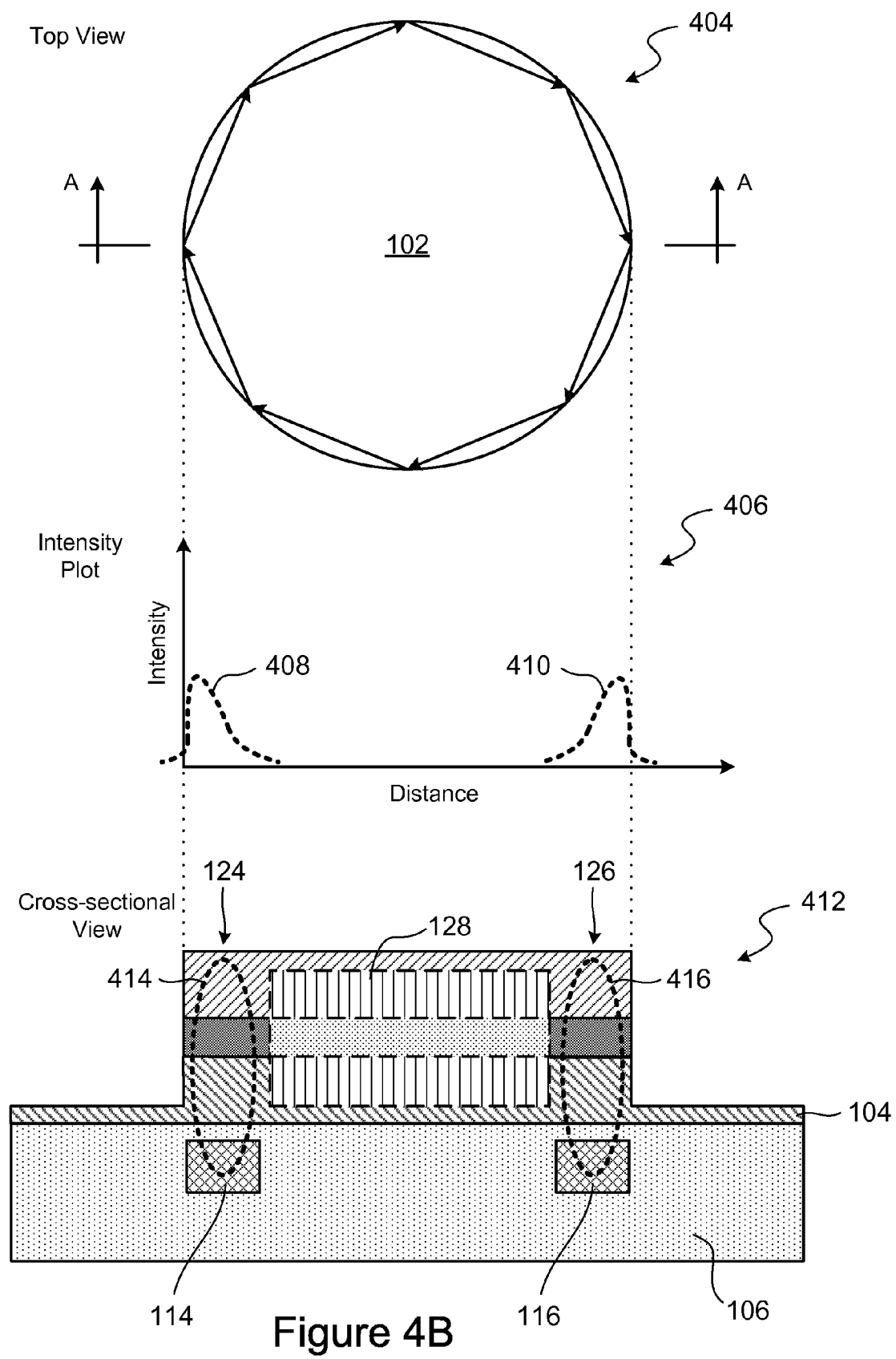
FIG. 4B shows substantial confinement of a whispering gallery mode to peripheral regions of a microdisk of the first microresonator system, shown in FIG. 1, in accordance with embodiments of the present invention.

Microdisk 102 embodiments of the present invention can be used to substantially confine ER to peripheral regions of microdisk 102 because the relatively wider bandgap, current isolation region 128 has a relatively lower index of refraction than the peripheral regions of microdisk 102. FIG. 4B shows substantial confinement of a WGM to peripheral regions of microdisk 102 in accordance with embodiments of the present invention. As shown in FIG. 4B, a top view 404 of microdisk 102 includes directional arrows located along the circumference of microdisk 102. The directional arrows represent a propagation direction of a hypothetical WGM propagating near the circumference of microdisk 102, and the length of the directional arrows corresponds to the wavelength λ of the WGM. Intensity plot 406 shows an intensity distribution of a WGM versus distance along line A-A in top view 404. Dashed-line intensity curves 408 and 410 show the WGM substantially confined near the circumference of microdisk 102. Portions of curves 408 and 410 that extend beyond the diameter of microdisk 102 represent evanescence of the WGM along the circumference of microdisk 102. Cross-sectional view 412 shows the portions 124 and 126 of the peripheral annular region occupied by the WGM. Dashed-line ellipses 414 and 416 show evanescent coupling of the WGM into waveguides 114 and 116. Thus current isolation region 128 provides for both current and optical isolation since the ER will be confined in the region of higher index of refraction.

Figure 5A:
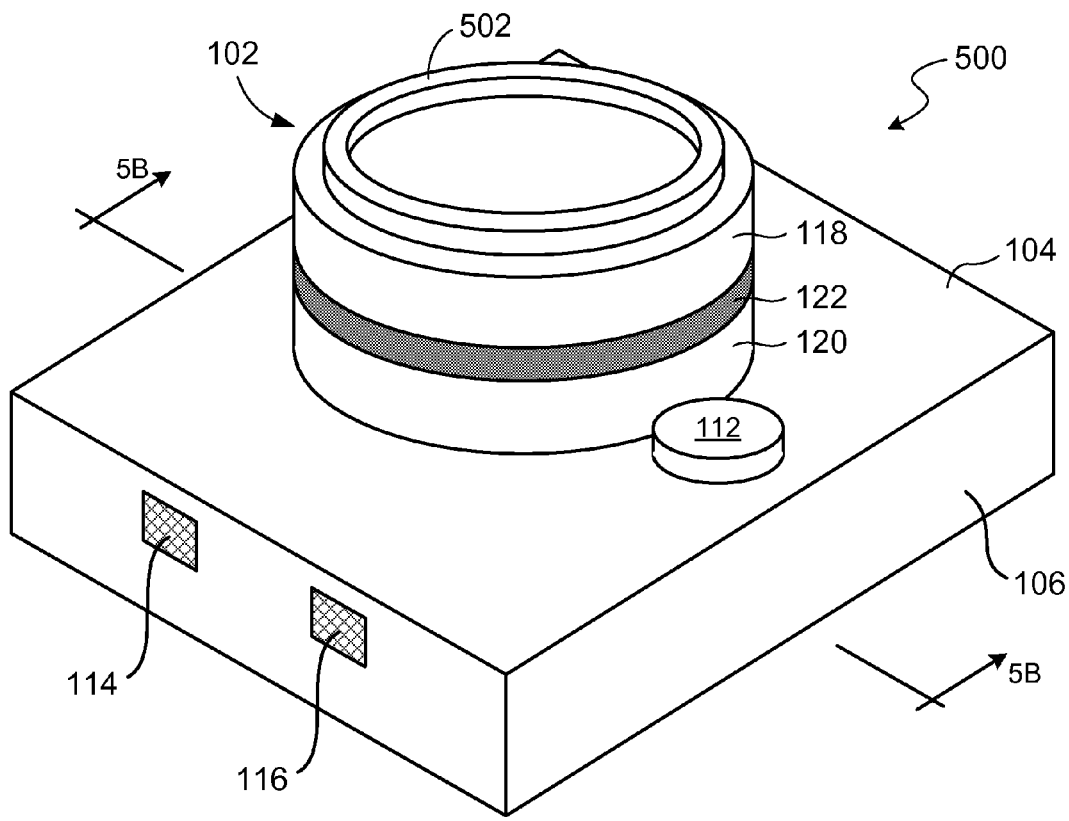
FIG. 5A shows an isometric view of a second microresonator system in accordance with embodiments of the present invention.
Figure 5B:
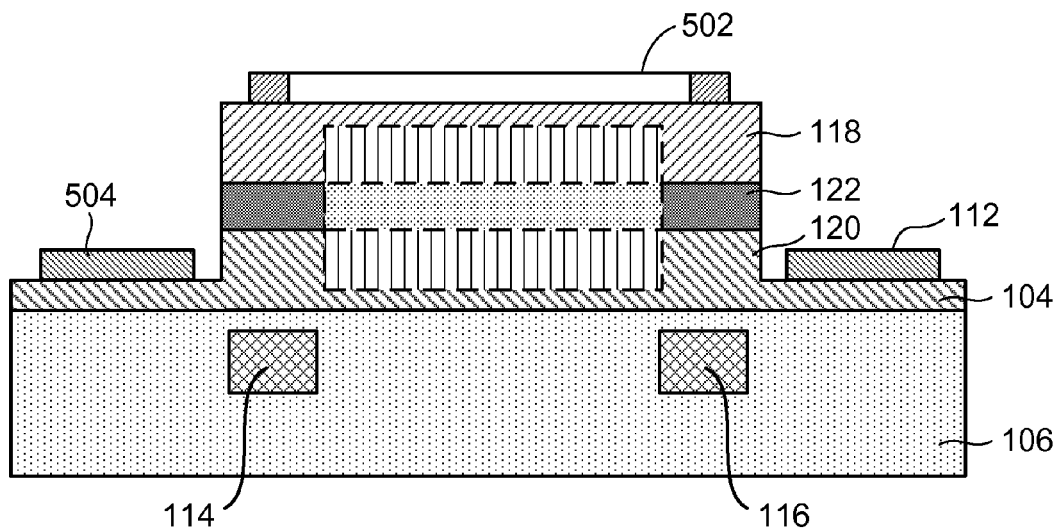
FIG. 5B shows a cross-sectional view of the second microresonator system along line 5B-5B, shown in FIG. 5A, in accordance with embodiments of the present invention.

FIG. 5A shows an isometric view of a second microresonator system 500 in accordance with embodiments of the present invention. Microresonator system 500 is identical to microresonator system 100, shown in FIG. 1, except the first electrode 108 has been replaced by a microring electrode 502 and a third electrode (not shown) is positioned on top surface layer 104 of substrate 106 adjacent to microdisk 102. FIG. 5B shows a cross-sectional view of microresonator system 500 along line 5B-5B, shown in FIG. 5A, in accordance with embodiments of the present invention. As shown in FIG. 5B, microring electrode 502 is positioned above and covers at least a portion of the top surface of microdisk 102. A third electrode 504 is positioned adjacent to microdisk 102 and is in electrical communication with bottom layer 120 via top surface layer 104.

Figure 6A:
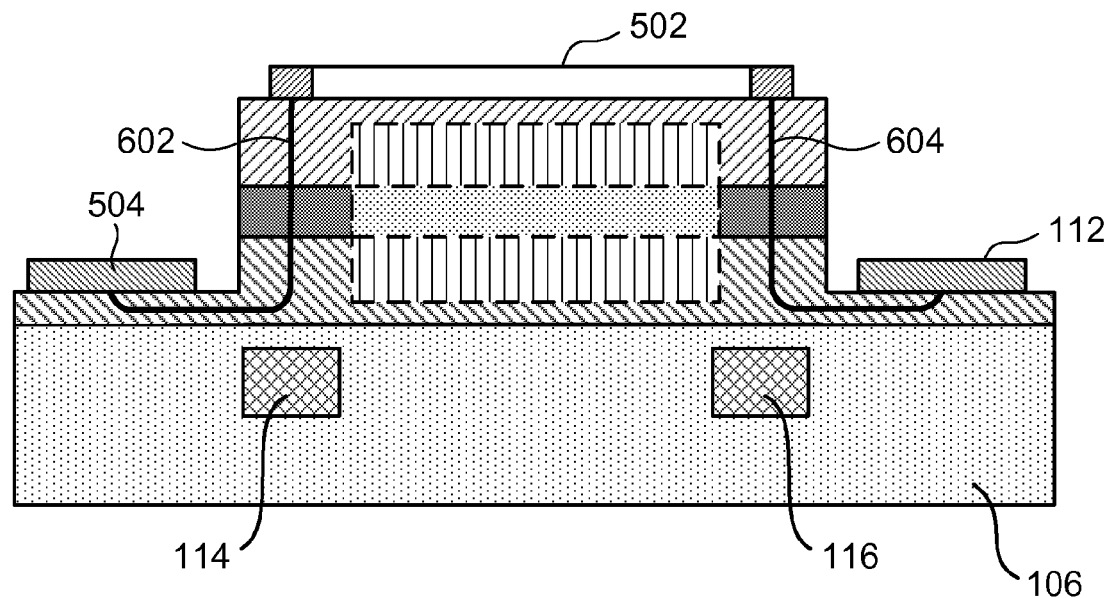
FIG. 6A shows paths of current flow in a microdisk of the second microresonator system, shown in FIG. 5, in accordance with embodiments of the present invention.
Figure 6B:
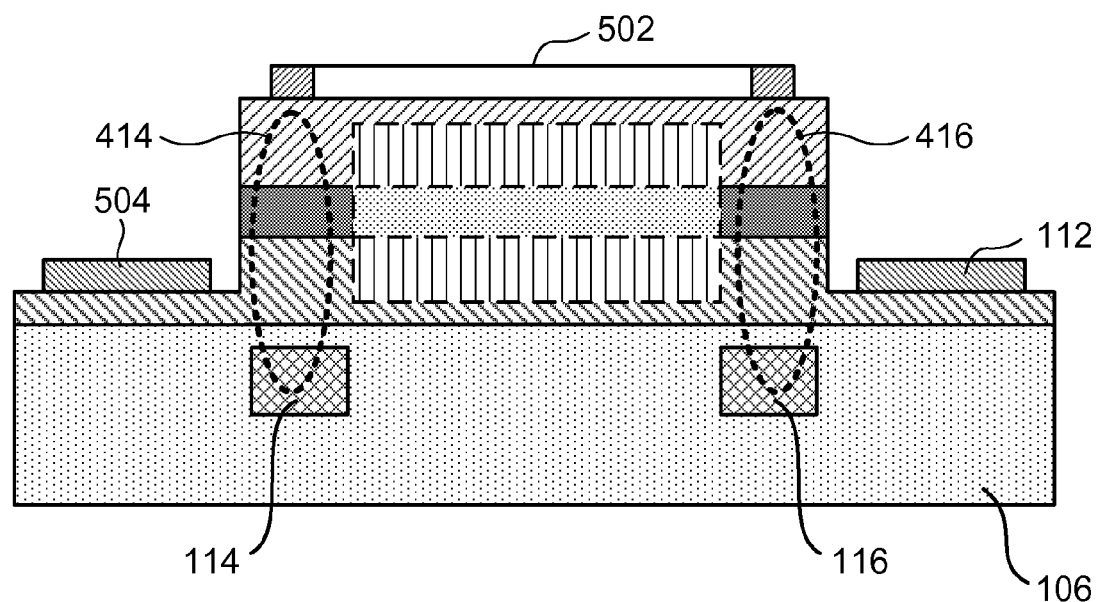
FIG. 6B shows substantial confinement of a whispering gallery mode to peripheral regions of a microdisk of the second microresonator system, shown in FIG. 5, in accordance with embodiments of the present invention.

Because microring electrode 502 is located above a portion of the peripheral region of microdisk 102, the flow of current between microring electrode 502 and electrodes 112 and 504 takes a more direct path than the path 402 shown in FIG. 4A. FIG. 6A shows paths 602 and 604 representing the flow of current between microring electrode 502 and electrodes 112 and 504 in accordance with embodiments of the present invention. Paths 602 and 604 represent more direct or lower resistance routes for current to flow between microring electrode 502 and second and third electrodes 112 and 504 than path 402. As shown in FIG. 6B, substantial confinement of a WGM to the peripheral region of microdisk 102 and evanescent coupling of the WGM into waveguides 114 and 116 is the same as the description provided above with reference to FIG. 4B.

Microdisk 102 can be used as a laser that generates coherent ER transmitted in waveguides 114 and 116. A laser comprises three basic components: a gain medium or amplifier, a pump, and feedback of the ER inside an optical cavity. The quantum wells of intermediate layer 122 comprise the gain medium, a current or voltage applied to electrodes 108 and 112 is the pump, and feedback is created by total internal reflection as a WGM generated by pumping quantum wells of intermediate layer 122 propagates near the circumference of microdisk 102.

Figure 7A:
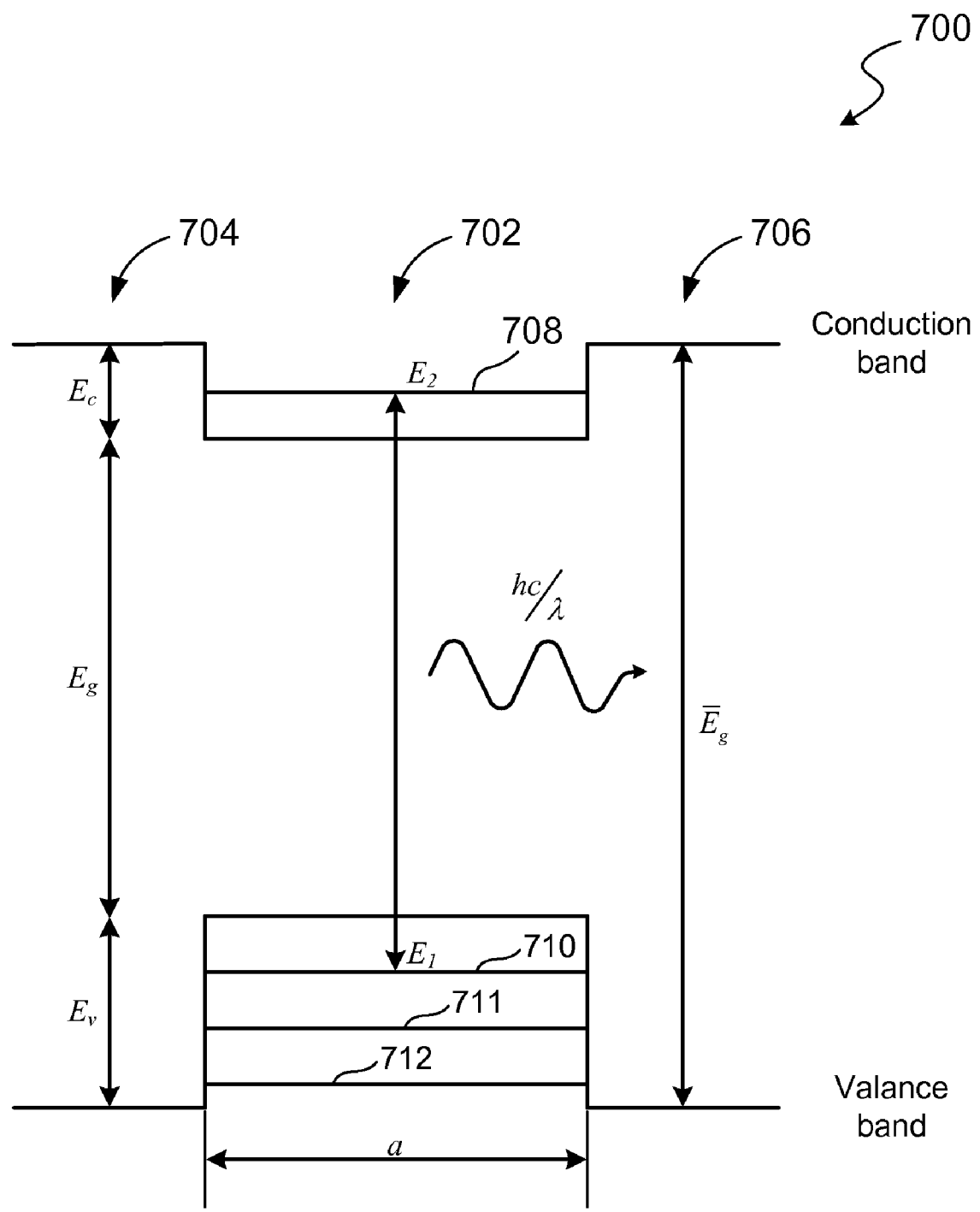
FIG. 7A shows an energy level diagram associated with quantized electronic energy states of a quantum well-based gain medium.

A gain medium can be comprised of at least one quantum well with a suitable bandgap. The quantum well size and the bulk material surrounding the quantum well determine the energy level spacing of electronic states in the quantum well. Typically, the quantum well is configured to have a relatively small number of quantized electronic energy levels in the valance band and a few quantized hole energy levels in the conduction band. Electrons transitioning from the lowest energy levels in the conduction band to energy levels in the valance band determine the emission wavelength λ of the gain medium. FIG. 7A shows an energy level diagram 700 associated with quantized electronic energy states of a quantum well-based gain medium of width a. Narrower region 702 with bandgap energy $E_g$ corresponds to a quantum well, and relatively wider regions 704 and 706 with bandgap energy $E_g$ correspond to bulk material surrounding the quantum well. As shown in FIG. 7A, the quantum well has a hole energy level 708 in the conduction band and three electronic energy levels 710-712 in the valence band. Because the gain medium comprises semiconductor material, an appropriate electronic stimulus, such as electrical pumping, promotes electrons from the valance band into the quantized levels in the conduction band, such as hole energy level 708. Spontaneous recombination of an electron in the conduction with a hole in the valance band results in emission of a photon having an energy given by hc/λ, where h is Plank's constant, and c is the speed of ER in a vacuum. A stimulated emission occurs as a result of photons in the WGM stimulating the gain medium to generate more photons at the same energy or wavelength. In both spontaneous and stimulated radiative emissions, the energy of the ER emitted is:

$$E_2 - E_1 = \frac{hc}{\lambda}$$

where $E_2$ is the energy level 708 of the electrons that have been pumped into the conduction band, and $E_1$ is the energy level 710 associated with holes in the valance band that combine with electron from the conduction band. As long as the electrical pump is applied to the gain medium, feedback caused by total internal reflection within microdisk 102 causes the intensity of the WGM to increase. Lasing occurs when the gain equals the loss inside microdisk 102. Microdisk 102 forms the optical cavity with gain, and the waveguides 114 and 116 couple the ER out of microdisk 102.

Figure 7B:
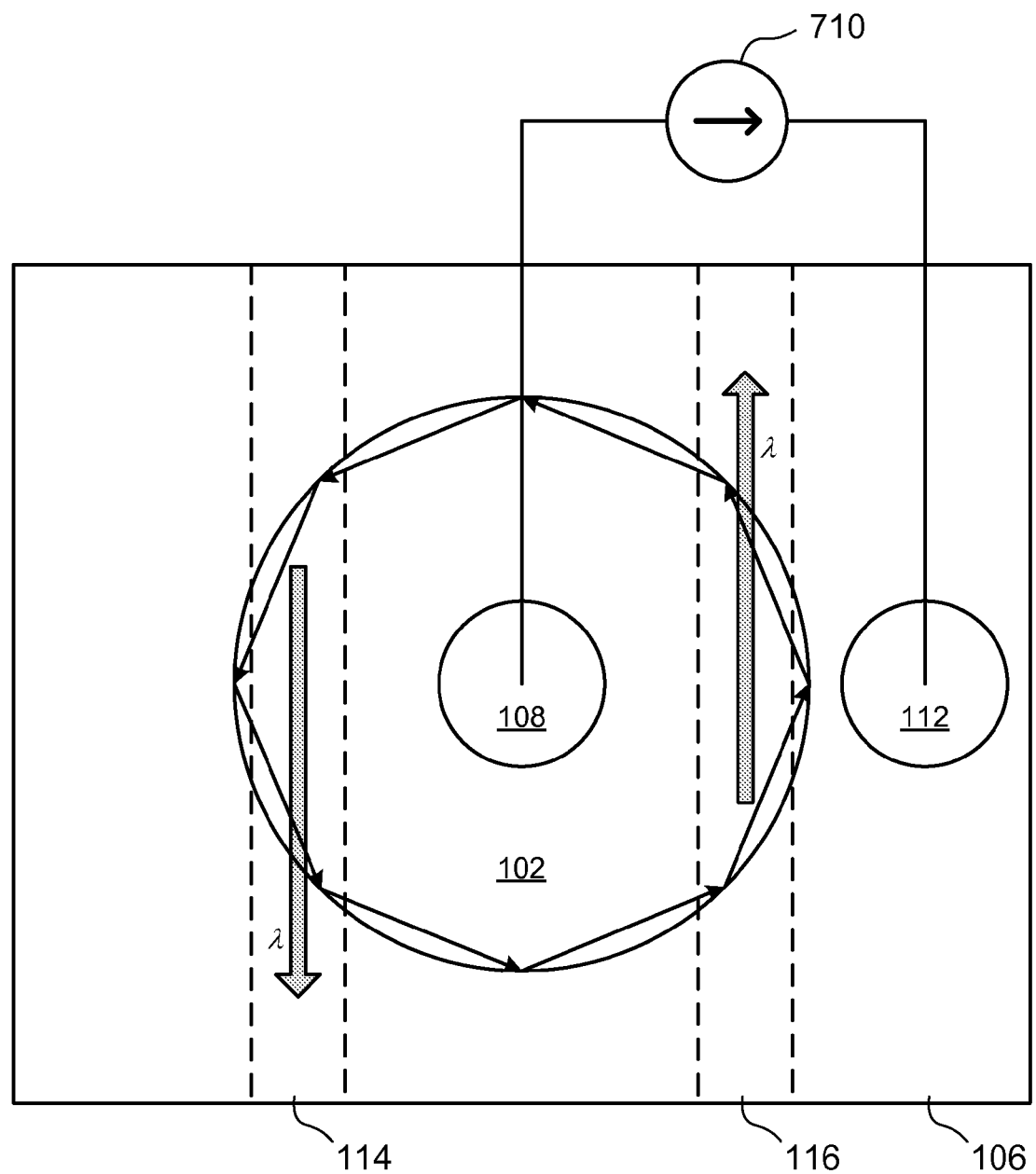
FIG. 7B shows a schematic representation of the first microresonator system, shown in FIG. 1, operated as a laser in accordance with embodiments of the present invention.

FIG. 7B shows a schematic representation of the first microresonator system, shown in FIG. 1, operated as a laser in accordance with embodiments of the present invention. As shown in FIG. 7B, electrodes 108 and 112 are connected to a current source 710. Quantum-well layers of microdisk 102 can be operated as a gain medium by pumping microdisk 102, as described above with reference to FIG. 7A, with a current of an appropriate magnitude supplied by current source 710. As a result, a WGM having a wavelength λ is generated within microdisk 102, and total internal reflection causes the WGM to propagate near the circumference of microdisk 102 as the intensity of the WGM increases. The WGM evanescently couples into the waveguides 114 and 116 yielding ER with a wavelength λ that propagates in waveguides 114 and 116.

Figure 8A:
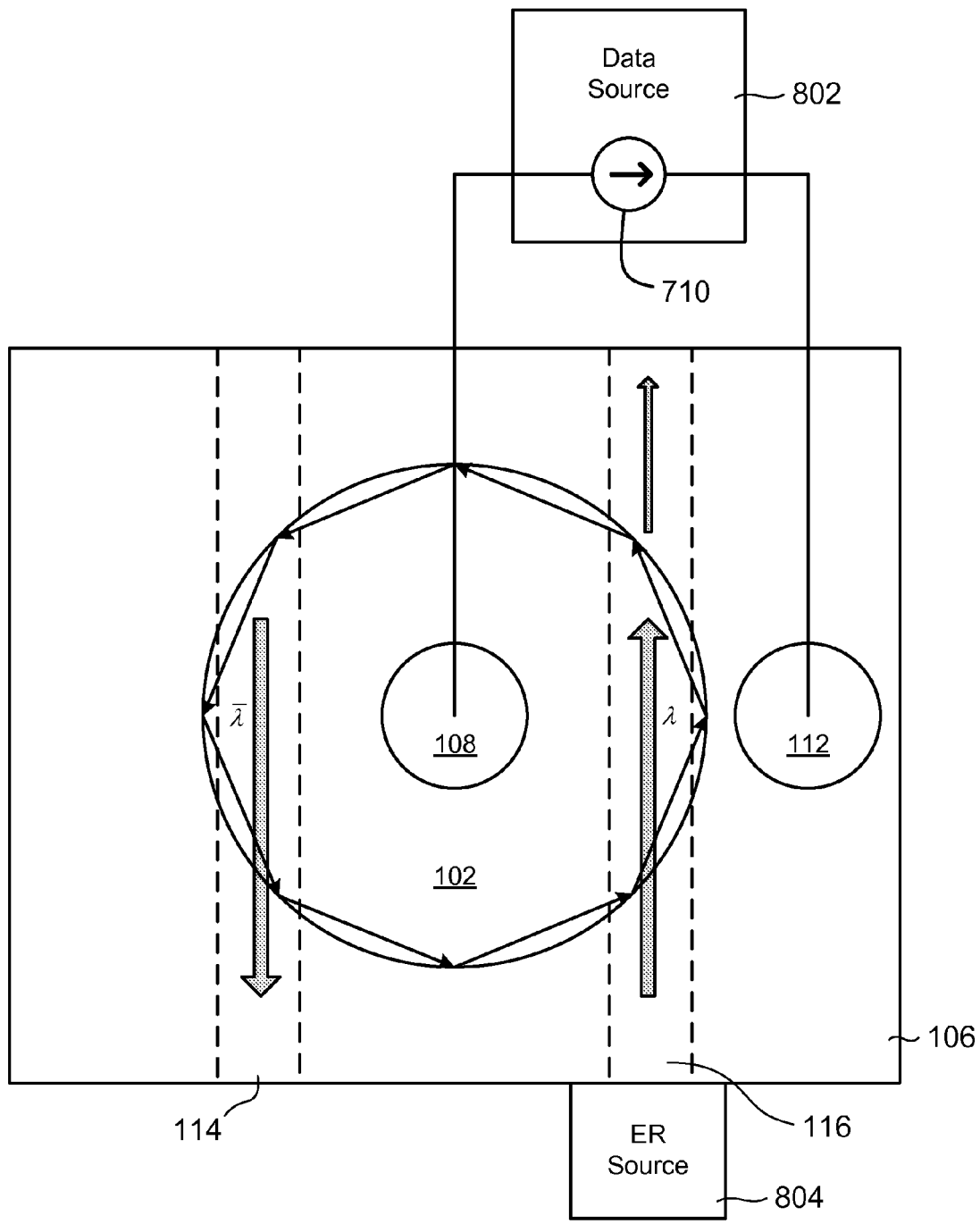
FIG. 8A shows a schematic representation of the first microresonator system, shown in FIG. 1, operated as a modulator in accordance with embodiments of the present invention.
Figure 8B:
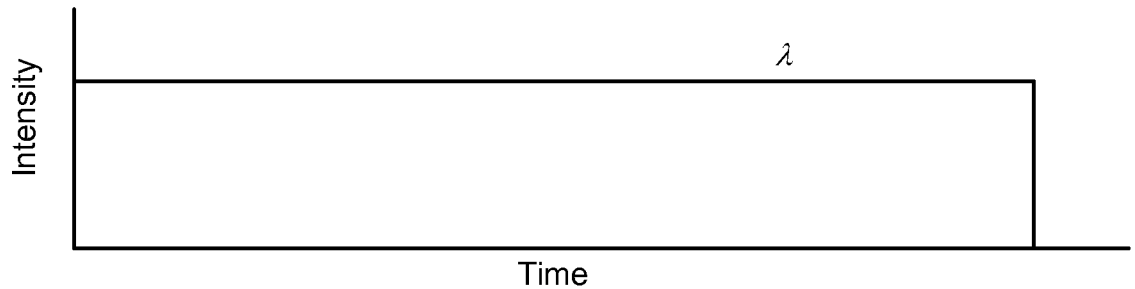
FIG. 8B shows a plot of intensity versus time of unencoded electromagnetic radiation.

FIG. 8A shows a schematic representation of the microresonator system 100, shown in FIG. 1, operated as a modulator in accordance with embodiments of the present invention. Current source 710 is connected to a data source 802, which can be a central processing unit, memory, or another data generating device. ER source 804 is coupled to waveguide 116 and emits ER with a substantially constant intensity over time, as shown in FIG. 8B. Returning to FIG. 8A, the amount of ER coupled into microdisk 102 depends on the detuning, the coupling coefficient, and the losses inside of microdisk 102. When the wavelength λ of the ER emitted by source 804 is detuned from the resonance of microdisk 102, the ER does not couple from waveguide 116 into microdisk 102. When the wavelength λ of the ER is at resonance with microdisk 102, the transmission of the ER propagating in the waveguide 116 is reduced because the ER is evanescently coupled into microdisk 102 creating a WGM. A portion of the ER transmitted in waveguide 116 evanescently couples into the peripheral region of microdisk 102 located above waveguide 116 and propagates in the peripheral region as a WGM with a wavelength λ. Data source 802 encodes data in the WGM by modulating the magnitude of the current generated by current source 710. Modulating the magnitude of the current transmitted between electrodes 108 and 112 causes the index of refraction of microdisk 102 to correspondingly change. When the index of refraction of microdisk 102 is changed, the resonant wavelength of microdisk 102 changes causing a detuning from the resonant wavelength of ER transmitted in waveguide 116. This in turn modulates the transmission of ER from waveguide 116 into microdisk 102 and subsequently modulates the intensity of the ER transmitted in waveguide 116. When waveguide 114 is present, ER can be transferred to waveguide 114 from the input waveguide 116 via microdisk 102. The amount of ER transferred to waveguide 114 depends on the coupling strength. Modulating the index of refraction of microdisk 102 results in a reduction in the intensity of the ER transmitted to waveguide 114. One can also modulate the intensity of the ER in waveguide 116 by adjusting the loss inside microring 102. This is accomplished by using the quantum confined stark effect which modulates the bandgap of the quantum well through the application of an applied voltage. Increasing the loss in microdisk 102 modulates the intensity transmitted past microdisk 102 in waveguides 114 and 116.

Figure 8C:
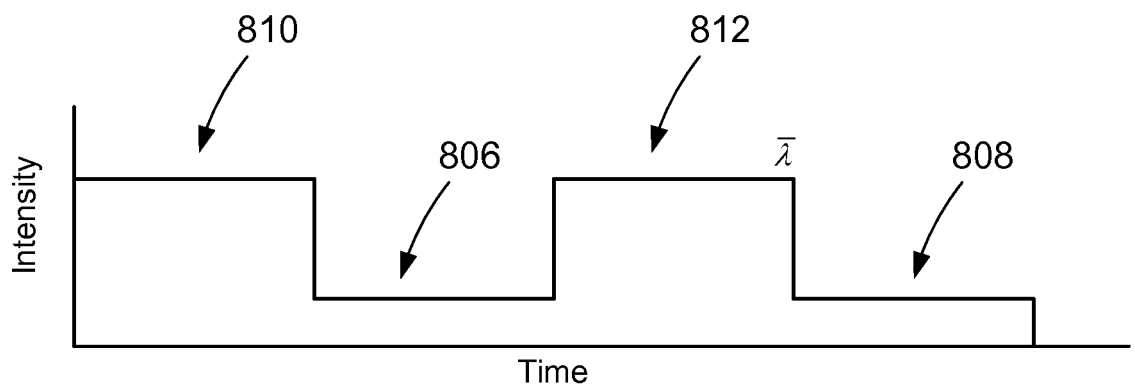
FIG. 8C shows a plot of intensity versus time for a data encoded electromagnetic radiation.

FIG. 8C shows intensity versus time of modulated ER where relatively lower intensity regions 806 and 808 correspond to a relatively higher index of refraction induced on microdisk 102. The relative intensities can be used to encode information by assigning a binary number to the relative intensities. For example, the binary number "0" can be represented in a photonic signal by low intensities, such as intensity regions 806 and 808, and the binary number "1" can be represented in the same photonic signal by relatively higher intensities, such as intensity regions 810 and 812.

Figure 9:
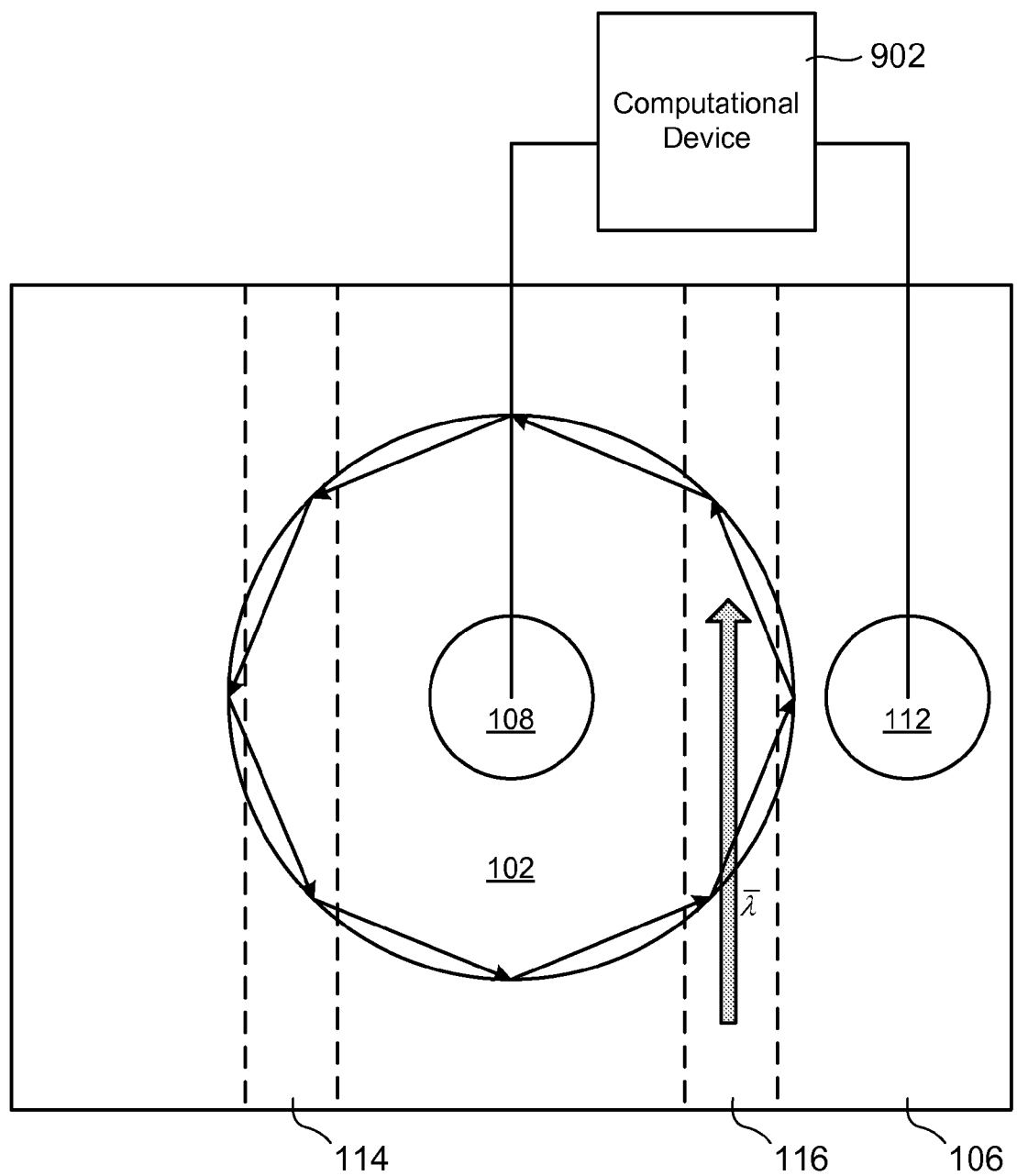
FIG. 9 shows a schematic representation of the first microresonator system, shown in FIG. 1, operated as a photodetector in accordance with embodiments of the present invention.

FIG. 9 shows a schematic representation of the first microresonator system, shown in FIG. 1, operated as a photodetector in accordance with embodiments of the present invention. In this configuration, the bandgap of the quantum wells is chosen to be less than the source of radiation of the input ER transmitted in waveguide 116. A reverse bias can also be applied to the electrodes so that an electric field is present inside the microresonator. The incoming ER coupled to the microresonator will be absorbed inside the quantum well generating an electron hole pair. The electric field inside the microring is such that the electrons and holes are separated and a current is generated at the electrodes 108 and 112. Modulated ER λ encoding information is transmitted in waveguide 116. The ER evanescently couples into the peripheral region of microdisk 102 producing a corresponding modulated WGM. Fluctuations in the intensity of the WGM propagating in the peripheral region induces a corresponding fluctuating current between electrodes 108 and 112. The fluctuating current is an electrical signal encoding the same data encoded in the modulated ER, which is processed by computational device 902.

Figure 10A:
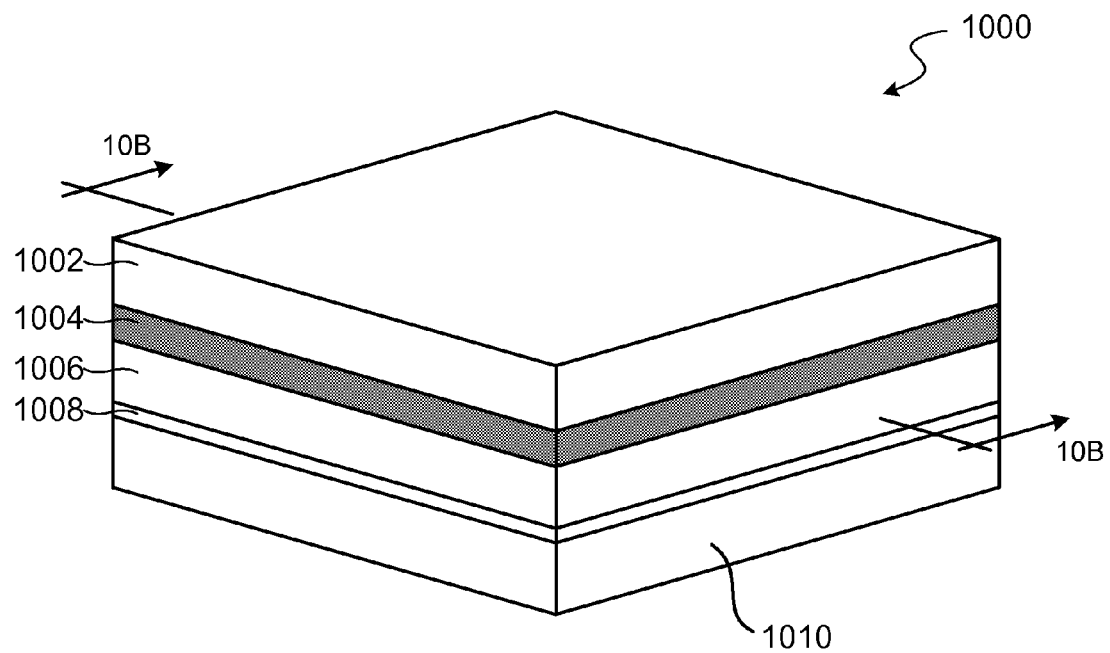
FIGS. 10A-10K show isometric and cross-sectional views that are associated with a method of fabricating the first microresonator system, shown in FIG. 1, in accordance with embodiments of the present invention.
Figure 10B:
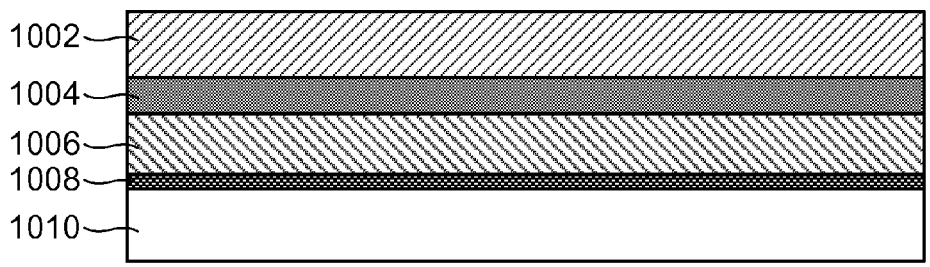

FIGS. 10A-10K show isometric and cross-sectional views that are associated with a method of fabricating microresonator system 100, shown in FIG. 1, in accordance with embodiments of the present invention. FIG. 10A shows an isometric view of a first structure 1000 comprising a top layer 1002, an intermediate layer 1004, a bottom layer 1006, and an etch stop layer 1008 supported by a phosphorus-based wafer 1010. Layers 1002 and 1006 can be comprised of n-type and p-type III-V semiconductors, such as InP or GaP doped with Si and Zn, respectively. Intermediate layer 1004 includes at least one quantum well, as described above with reference to FIG. 2. Etch stop layer 1008 can be a thin layer of latticed matched $In_{0.53}Ga_{0.47}As$. Layers 1002, 1004, and 1006 can be deposited using molecular beam expitaxy ("MBE"), liquid phase epitaxy ("LPE"), hydride vapor phase epitaxy ("HVPE"), metalorganic vapor phase expitaxy ("MOVPE"), or another suitable expitaxy method. FIG. 10B shows a cross-sectional view of layers 1002, 1004, 1006, 1008, and wafer 1010.

Figure 10C:
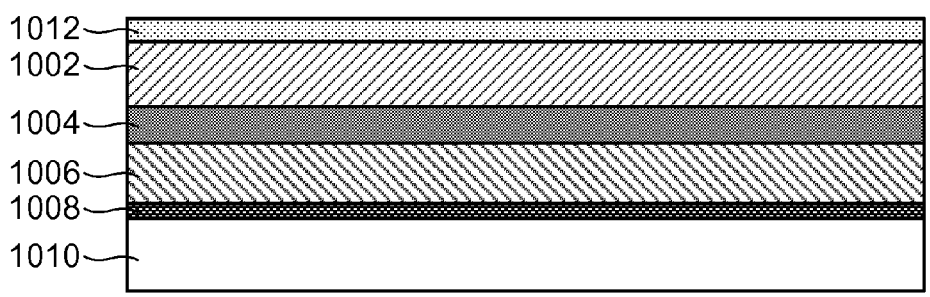

Next, as shown in the cross-sectional view of FIG. 10C, sputtering can be used to deposit an oxide layer 1012 over top layer 1002. Oxide layer 1012 can be used to facilitate wafer bonding of top layer 1002 onto substrate 106, as described below with reference to FIG. 10G. Layer 1012 can be $SiO_2$, $Si_3N_4$, or another suitable dielectric material that substantially enhances wafer bonding to substrate 106.

Figure 10D:
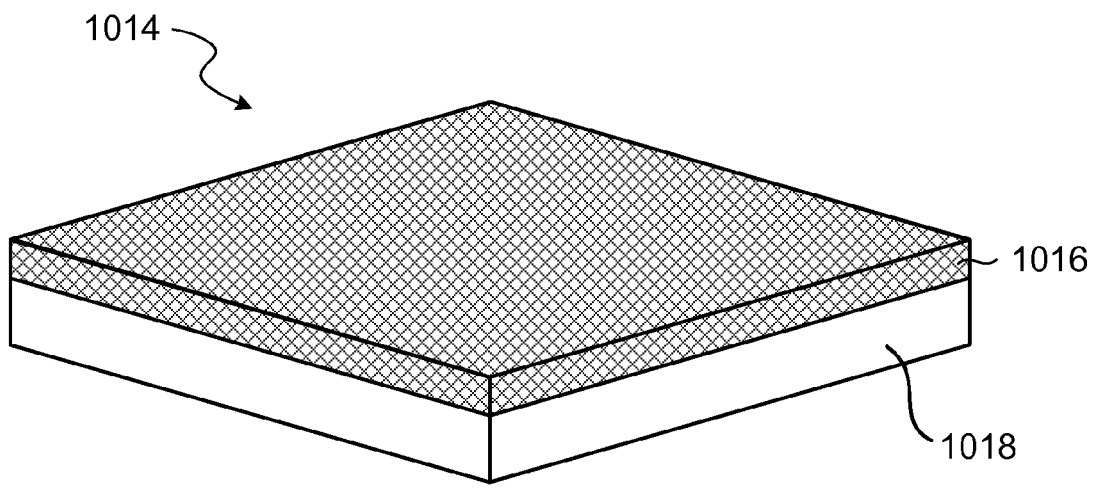
Figure 10E:
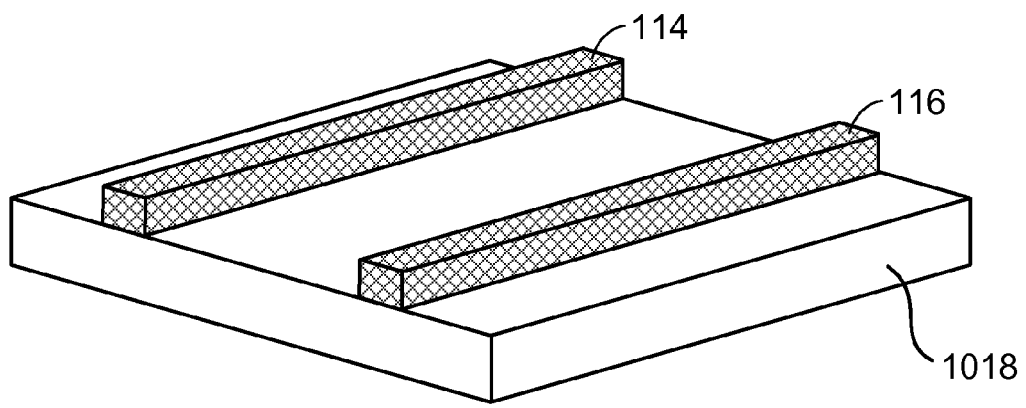
Figure 10F:
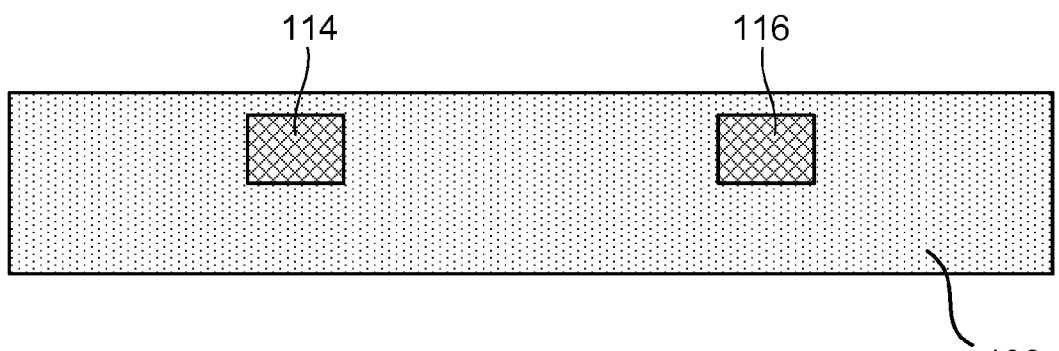

FIG. 10D shows a silicon-on-insulator substrate ("SOI") wafer 1014 having a Si layer 1016 on an oxide substrate layer 1018. Silicon waveguides 114 and 116 can be fabricated in Si layer 1016 as follows. A photoresist can be deposited over Si layer 1016 and a photoresist mask of waveguides 114 and 116 can be patterned in the photoresist using UV lithography. Waveguides 114 and 116 can then be formed in Si layer 1014 using a suitable etch system, such as inductively coupled plasma etcher ("ICP"), and a low-pressure, high-density etch system with a chemistry based on $Cl_2/HBr/He/O_2$. After waveguides 114 and 116 have been formed in Si layer 1016, a solvent can be used to remove the photoresist mask leaving waveguides 114 and 116, as shown in FIG. 10E. An oxide layer comprised of the same oxide material as substrate 1018 can be deposited over waveguides 114 and 116 using liquid-phase, chemical-vapor deposition. Chemical mechanical polishing ("CMP") processes may be used to planarize the deposited oxide in order to form substrate 106 with embedded waveguides 114 and 116, as shown in the cross-sectional view of substrate 106 in FIG. 10F.

Figure 10G:
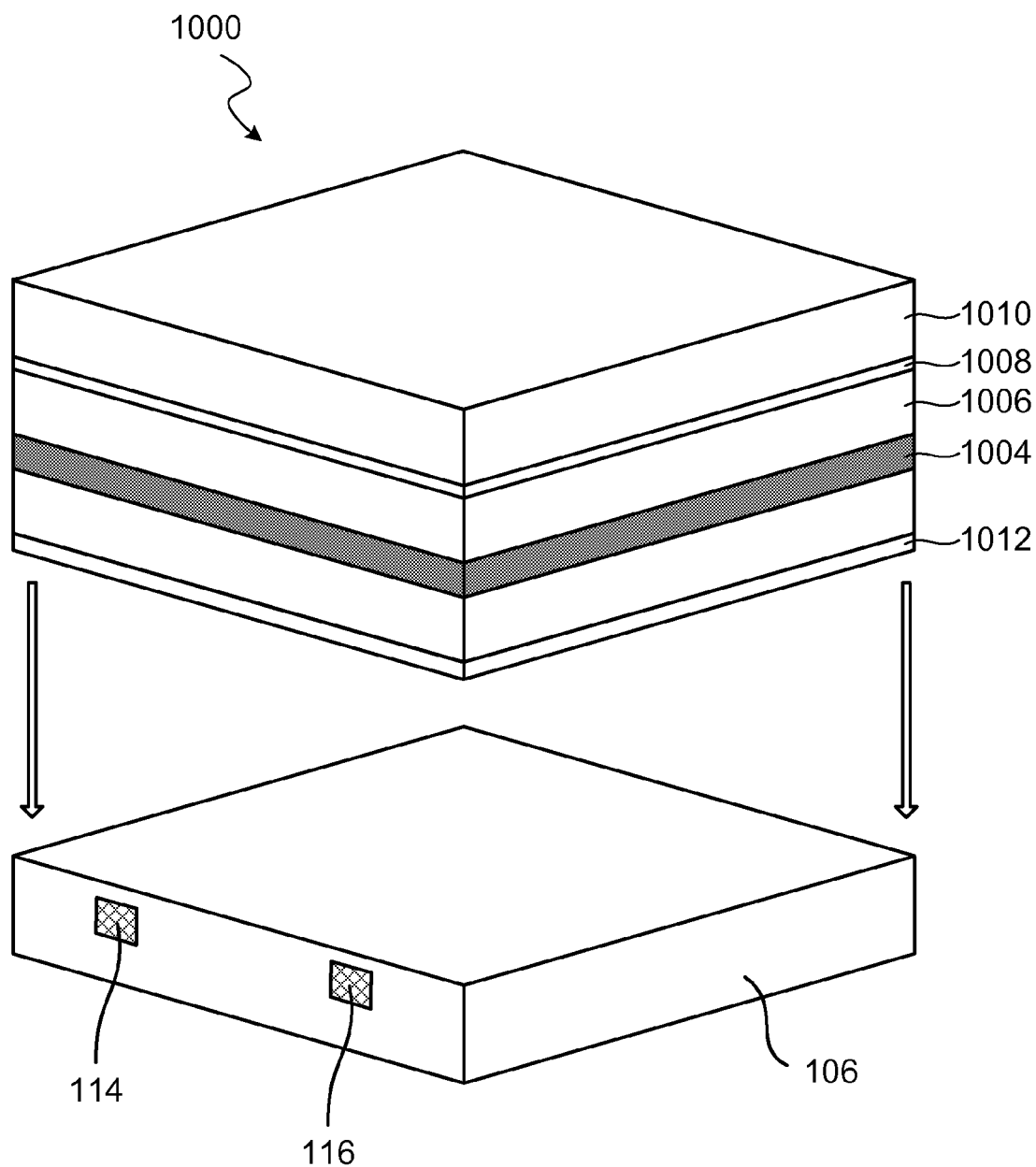
Figure 10H:
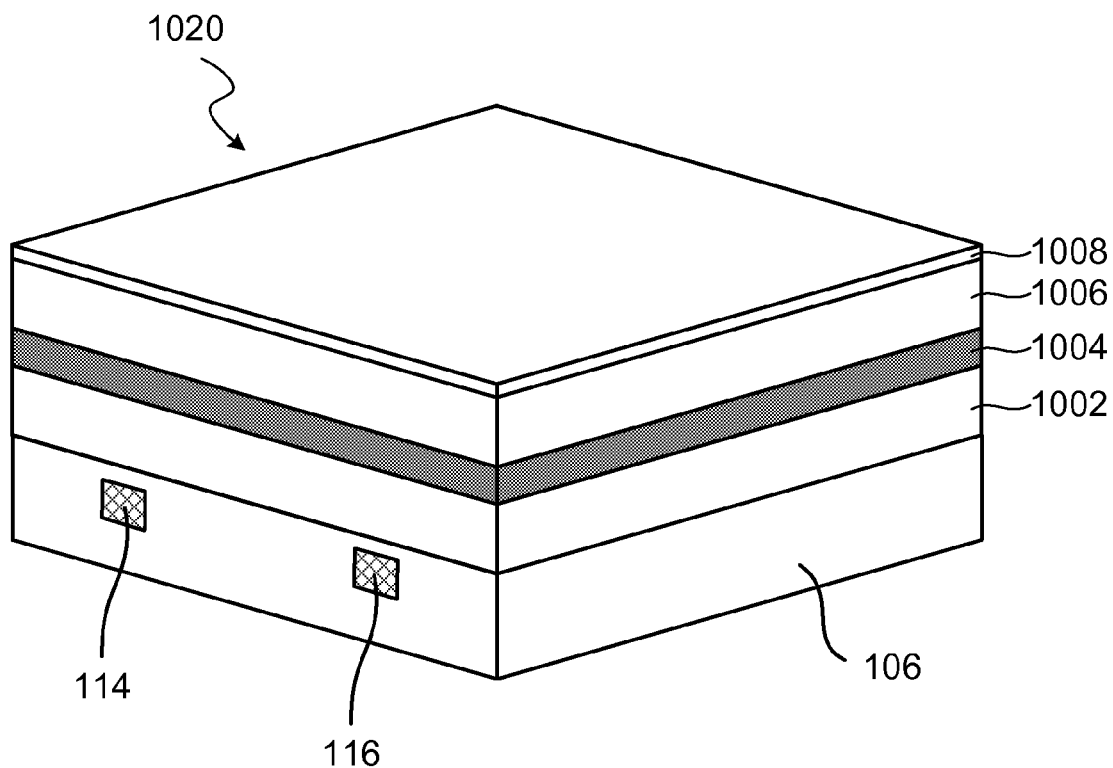

Next, as shown in FIG. 10G, first structure 1000 is inverted and wafer bonding is used to attach oxide layer 1012 to the top surface of substrate 106. Selective wet etching can be used to remove layer 1010 in order to obtain a second structure 1020 shown in FIG. 10H. Etch stop layer 1008 can be included to stop the etching process from reaching layer 1006. Hydrochloric acid can also be used to remove an InP-based wafer 1010 because there is an etch selectivity between the InP and the InGaAs of etch stop layer 1008.

Figure 10I:
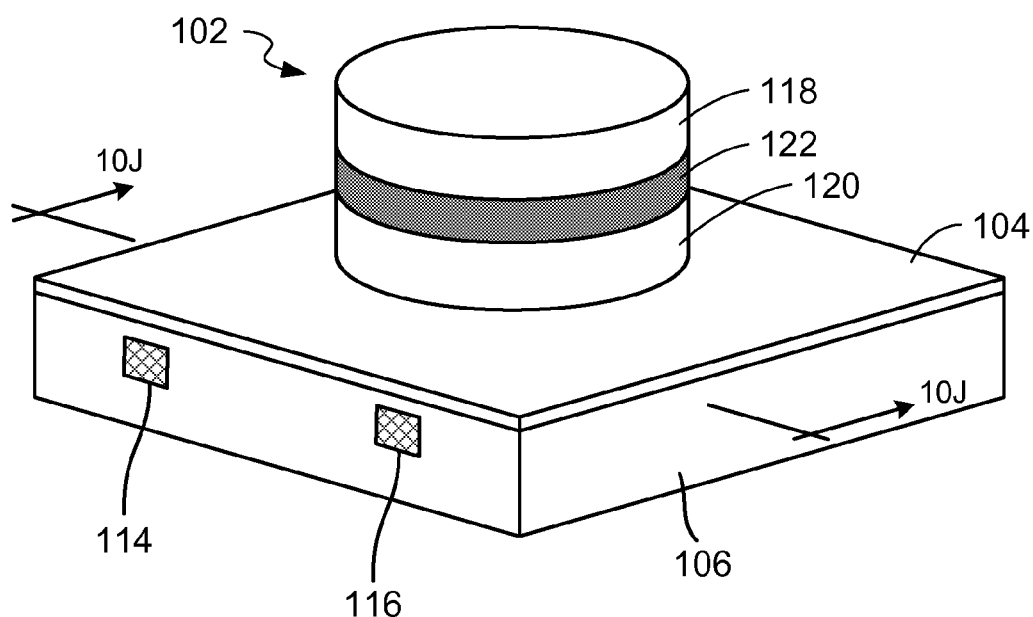

Next, reactive ion etching ("RIE"), chemically assisted ion beam etching ("CAIBE"), or inductively coupled plasma ("ICP") etching can be used to etch layers 1002, 1004, and 1006 into the form of microdisk 102, as shown in FIG. 10I. A portion of layer 1002 adjacent to substrate 106 is left in order to from top surface layer 104.

Figure 10J:
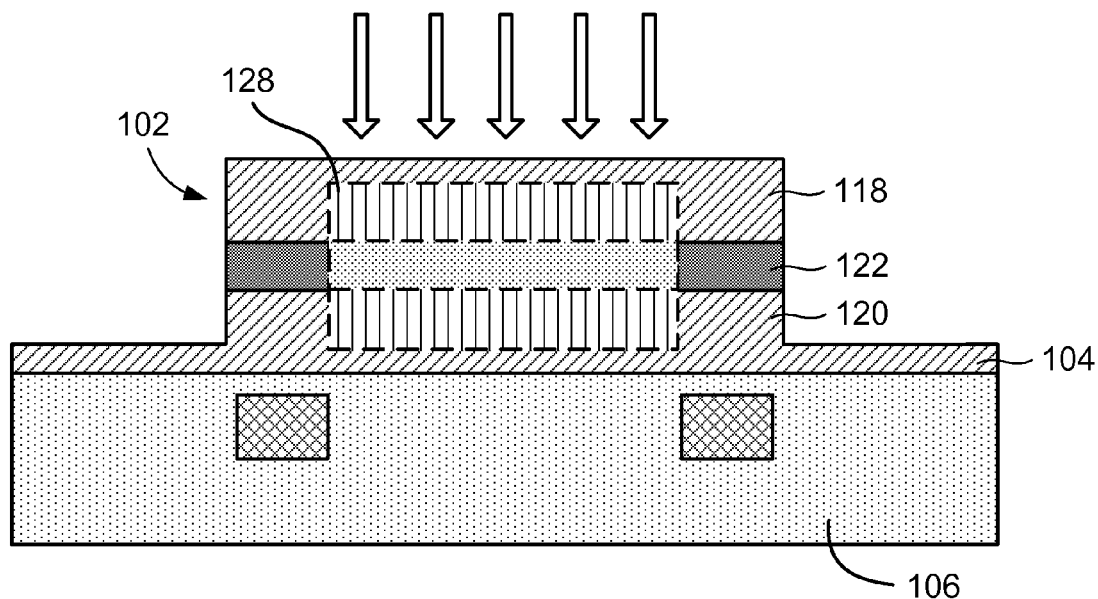

FIG. 10J shows a cross-sectional view of microdisk 102 and substrate 106 along a line 10J-10J, shown in FIG. 10I. Current isolation region 128 is formed in at least a portion of a central region of the microdisk 102 using impurity induced disordering ("IID") and annealing. IID methods are well-known in the art and are described in "A quantum-well-intermixing process for wavelength-agile photonic integrated circuits," by E. J. Skogen et al., *IEEE J. of Selected Topics in Quantum Electronics*, Vol. 8, No. 4, 2002. IID intermixes the different compositions of the layers 118, 120, and 122 where the impurity is introduced. After annealing, the intermixed region's bandgap shifts to a relatively larger bandgap. Impurities can be introduced in the desired regions by masking and employing standard photolithographic processes.

Figure 10K:
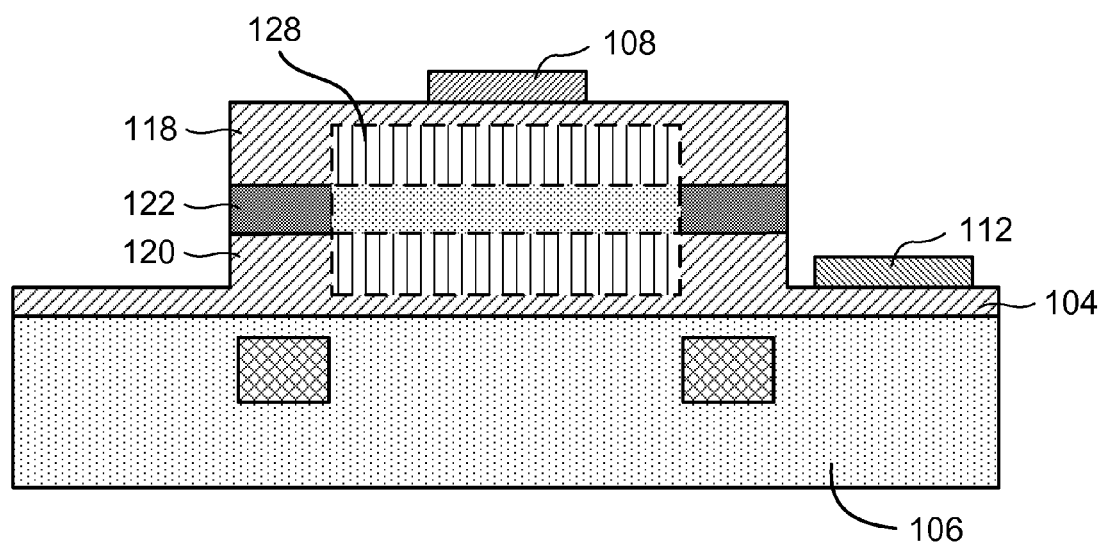

After IID, a dopant can be implanted in top layer 118 to form a p-type semiconductor top layer 118 since the IID will also tend to reduce the doping level of a disordered region. For example, Zn serves as a p-type semiconductor dopant for top layer 118 comprised of InP. As shown in FIG. 10K, material comprising first electrode 108 and second electrode 112 can be deposited by e-beam evaporation, and patterned to form electrodes 108 and 112 using standard photolithographic processes. A metal with a p-type dopant, such as AuZn, can be used in first electrode 108 to obtain a p-type contact, and a metal with an n-type dopant, such as AuGe, can be used in second electrode 112 to obtain an n-type contact 112.

Figure 11A:
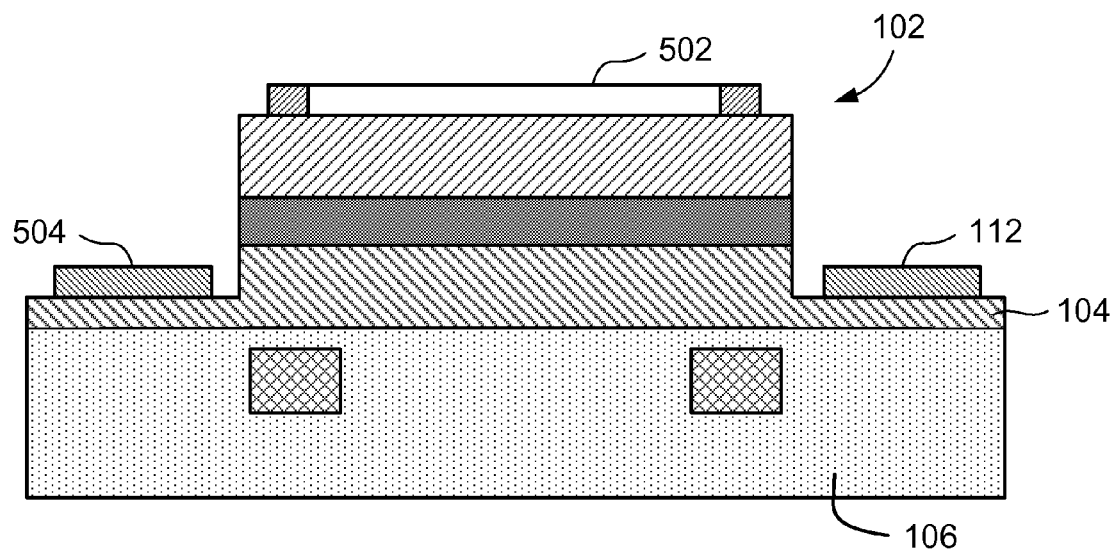
FIGS. 11A-11B show cross-sectional views that are associated with a method of fabricating the second microresonator system, shown in FIG. 5, in accordance with embodiments of the present invention.
Figure 11B:
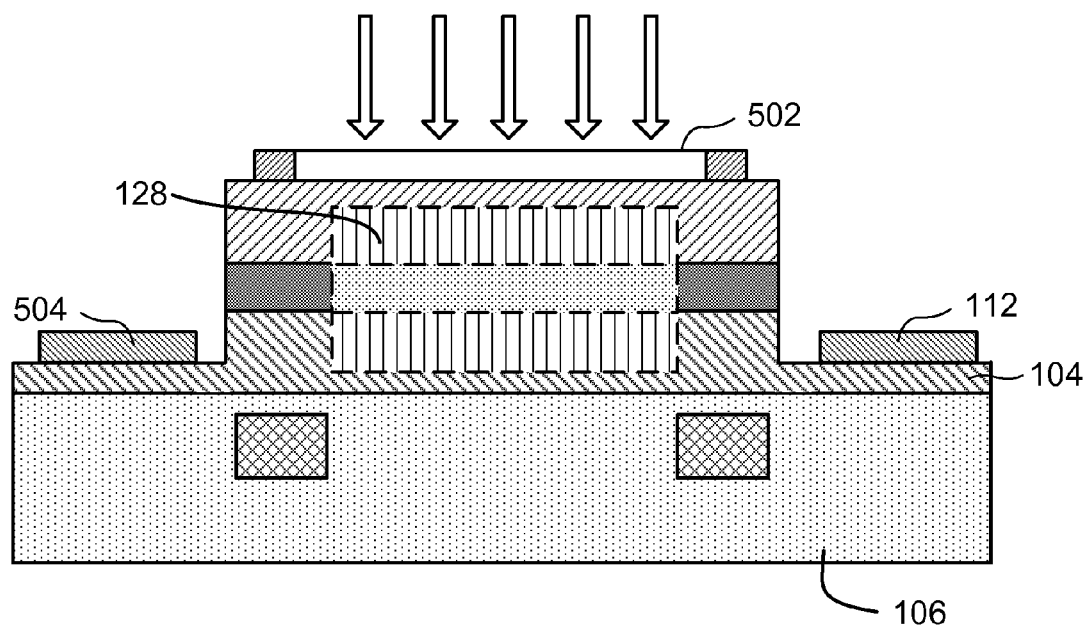

FIGS. 11A-11B show cross-sectional views that are associated with a method of fabricating photonic system 500, shown in FIG. 5, in accordance with embodiments of the present invention. Forming microdisk 102 and forming waveguides 114 and 116 in substrate 106 can be accomplished as described above with reference to FIGS. 10A-10I. As shown in FIG. 11A, material comprising microring electrode 502 and electrodes 112 and 504 can be deposited and patterned as described above with reference to FIG. 10K. A metal with a p-type dopant can be used in first electrode 108 to obtain a p-type contact, and a metal with an n-type dopant can be used in electrodes 112 and 504 to obtain n-type contacts. Next, a mask layer can be placed over microring electrode 502 and IID can be used to form current isolation region 128 in microdisk 102. After IID, a dopant can be implanted in top layer 118 to form p-type top layer 118, as described above with reference to FIG. 10J.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A method of fabricating a microresonator system, the method comprising:
    forming a multilayer system having a bottom layer, a top layer, and an intermediate layer having one or more quantum wells and sandwiched between the bottom layer and the top layer;
    embedding at least one waveguide in a substrate having a top surface, the at least one waveguide positioned adjacent to the top surface of the substrate;
    wafer bonding the top layer of the multilayer system to the top surface of the substrate;
    forming a microresonator in the multilayer system, wherein at least a portion of a peripheral annular region of the microresonator is portioned above the at least one waveguide; and
    forming a current isolation region in at least a portion of a central region of the microresonator.

2. The method of claim 1 wherein forming the multilayer system further comprises:
    depositing a p-type semiconductor bottom layer on a second substrate;
    depositing one or more quantum-well layers on the bottom layer; and
    depositing an n-type semiconductor top layer on the one or more quantum-well layers.

3. The method of claim 1 wherein depositing the top, the bottom, and the one or more quantum-well layers further comprises employing one of:
    molecular beam expitaxy;
    liquid phase expitaxy;
    hydride vapor phase expitaxy;
    metalorganic vapor phase expitaxy; and
    another suitable expitaxy method.

4. The method of claim 1 wherein embedding waveguides in the substrate further comprises:
    providing a silicon-on-insulator substrate having a silicon layer and an oxide layer;
    depositing a photoresist layer on the silicon layer;
    forming a photoresist mask of waveguides in the photoresist layer;
    etching waveguides in the silicon layer;
    removing the photoresist mask; and
    depositing an oxide layer over the waveguides.

5. The method of claim 1 wherein wafer bonding the top layer of the multilayer system to the top surface of the substrate further comprises depositing a first oxide layer on a top layer of the multilayer system and depositing a second oxide layer on the top surface of the substrate.

6. The method of claim 1 wherein forming the microresonator in the multilayer system further comprises employing one of:
    reactive ion etching;
    chemically assisted ion beam etching; and
    inductively coupled plasma.

7. The method of claim 1 wherein forming the current isolation region in at least a portion of the central region of the microresonator further comprises impurity induced disordering and annealing.

8. The method of claim 1 further comprising:
    forming a first electrode on the top surface of the microresonator; and
    forming at least one second electrode on the top surface of the substrate adjacent to the microresonator.

* * * * *

UNITED STATES PATENT AND TRADEMARK OFFICE
CERTIFICATE OF CORRECTION

PATENT NO. : 7,972,882 B2  Page 1 of 1
APPLICATION NO. : 12/479604
DATED : July 5, 2011
INVENTOR(S) : Michael Renne Ty Tan et al.

It is certified that error appears in the above-identified patent and that said Letters Patent is hereby corrected as shown below:

In column 10, line 29, in Claim 3, delete "expitaxy;" and insert -- epitaxy; --, therefor.

In column 10, line 30, in Claim 3, delete "expitaxy;" and insert -- epitaxy; --, therefor.

In column 10, line 31, in Claim 3, delete "expitaxy;" and insert -- epitaxy; --, therefor.

In column 10, line 32, in Claim 3, delete "expitaxy;" and insert -- epitaxy; --, therefor.

In column 10, line 33, in Claim 3, delete "expitaxy" and insert -- epitaxy --, therefor.

Signed and Sealed this
Twenty-seventh Day of March, 2012

David J. Kappos
*Director of the United States Patent and Trademark Office*